(12) United States Patent
Lee

(10) Patent No.: US 7,645,699 B2
(45) Date of Patent: Jan. 12, 2010

(54) METHOD OF FORMING A DIFFUSION BARRIER LAYER USING A TASIN LAYER AND METHOD OF FORMING A METAL INTERCONNECTION LINE USING THE SAME

(75) Inventor: Han-Choon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 224 days.

(21) Appl. No.: 11/317,362

(22) Filed: Dec. 23, 2005

(65) Prior Publication Data

US 2006/0148246 A1 Jul. 6, 2006

(30) Foreign Application Priority Data

Dec. 30, 2004 (KR) ............... 10-2004-0117132

(51) Int. Cl.
*H01L 21/44* (2006.01)
(52) U.S. Cl. ...................... 438/658; 438/659
(58) Field of Classification Search ........... 438/658, 438/659
See application file for complete search history.

(56) References Cited

U.S. PATENT DOCUMENTS

| | | | |
|---|---|---|---|
| 6,376,371 B1 | 4/2002 | Jain et al. | |
| 6,436,825 B1 * | 8/2002 | Shue | 438/687 |
| 6,562,715 B1 * | 5/2003 | Chen et al. | 438/643 |
| 6,576,546 B2 * | 6/2003 | Gilbert et al. | 438/629 |
| 2002/0005582 A1 * | 1/2002 | Nogami et al. | 257/758 |
| 2005/0020080 A1 * | 1/2005 | Chiang et al. | 438/689 |

FOREIGN PATENT DOCUMENTS

| | | |
|---|---|---|
| KR | 10-1998-0080896 | 11/1998 |
| KR | 10-2004-0009789 | 1/2004 |

OTHER PUBLICATIONS

Proust, M. "CVD and PVD copper integration for dual damascene metallization in a 0.18 um process" Microelectronic Engineering 55 (2001) pp. 269-275.*
Haebum, L "The influence of barrier types on the microstructure and electromigration characteristics of electroplated copper" Thin film Solids 492 (2005) pp. 279-284.*
Gyeong Su Cho; Semiconductor Device and Fabricating Method Thereof; Korean Patent Abstracts; Publication No. 1020040009789 A; Publication Date; Jan. 31,2004; 2 Pages; Korean Intellectual Property Office, Republic of Korea.
Method for Forming a Semiconductor Device; Patent Abstracts of Korea; Publication No. 10-1998-080896; Publication Date; Nov. 25, 1998; 1 Page.

* cited by examiner

*Primary Examiner*—N Drew Richards
*Assistant Examiner*—Grant S Withers
(74) *Attorney, Agent, or Firm*—The Law Offices of Andrew D. Fortney; Andrew D. Fortney

(57) ABSTRACT

The present invention provides a method of forming a diffusion barrier layer comprising a TaSiN layer. The method includes depositing a TaN layer into a via hole which penetrates an insulation layer exposing a first metal line layer, and transforming the TaN layer into a TaSiN layer using a radio frequency (RF) power and a (remote) plasma using $SiH_4$ gas. Transforming the TaN layer into a TaSiN layer may include: loading a structure including the TaN layer into a plasma reaction chamber; injecting $SiH_4$ gas into the plasma reaction chamber; and forming the TaSiN layer by reacting Si— or Si atom-containing species with the TaN layer.

20 Claims, 2 Drawing Sheets

METHOD OF FORMING A DIFFUSION BARRIER LAYER USING A TASIN LAYER AND METHOD OF FORMING A METAL INTERCONNECTION LINE USING THE SAME

CROSS-REFERENCE TO RELATED APPLICATION

This application claims priority to and the benefit of Korean Patent Application No. 10-2004-0117132, filed in the Korean Intellectual Property Office on Dec. 30, 2004, the entire contents of which are incorporated herein by reference.

BACKGROUND OF THE INVENTION (a) Field of the Invention

The present invention relates to a method of manufacturing a semiconductor device. More particularly, the present invention relates to a method of forming a diffusion barrier layer comprising a TaSiN layer and a method of forming a metal interconnection line using the same.

(b) Description of the Related Art

Recently, during a process of manufacturing a semiconductor device, a diffusion barrier has frequently been formed in order to prevent a metal material from diffusing into silicon and/or an insulating layer (and often, vice versa). Such a diffusion barrier layer is desired to have a more uniform and lower resistivity due to higher integration of a semiconductor device. More particularly, when a scale of a semiconductor device is 60 nm or less, a diffusion barrier layer is required to have a thickness of about 50 Å or less in order to decrease a delay time caused by contact resistance.

Recently, a ternary nitride layer such as a tantalum-silicon-nitride (TaSiN) layer has more frequently been used as a diffusion barrier layer than a binary nitride layer, such as a titanium nitride (TiN) or tantalum nitride (TaN) layer, because a ternary nitride layer containing Si shows better performance than a binary nitride layer. When a TaN layer is deposited by a physical vapor deposition (PVD) method, the TaN layer generally has a thickness of at least about 50 Å to enable its use as a diffusion barrier for a device having a scale of 60 nm or less. Therefore, a TaN layer formed by the PVD method may show poor step coverage. Similarly, when a TaSiN layer is deposited by a PVD method, there is a merit that an excellent TaSiN layer having little or no impurities can be formed by a simple process. However, when a TaSiN layer is used as a diffusion barrier for a device having a scale of 60 nm or less, it may also show poor step coverage.

Therefore, much research is under investigation for depositing a TaSiN layer by a chemical vapor deposition (CVD) or atomic layer deposition (ALD) method rather than a PVD method. However, such alternative methods may have drawbacks including a complicated and/or relatively slow process and a low yield.

The above information disclosed in this Background section is only for enhancement of understanding of the background of the invention, and therefore, it may contain information that does not form prior art or other information that is already known in this or any other country to a person of ordinary skill in the art.

SUMMARY OF THE INVENTION

The present invention has been made in an effort to provide a method of forming a diffusion barrier layer comprising a TaSiN layer which is appropriate for a device having a scale of 60 nm or less and which may be formed by a PVD method. The present invention is capable of depositing an excellent thin film by a simple process. Such a method may be applied to a method of forming a metal interconnection line comprising a TaSiN diffusion barrier layer.

An exemplary method of forming a TaSiN diffusion barrier layer according to an embodiment of the present invention includes depositing a TaN layer into a via hole which penetrates an intermetal insulation layer so as to expose a first metal line layer, and transforming the TaN layer into a TaSiN layer using a radio frequency (RF) power and a remote plasma comprising $SiH_4$ gas.

Depositing the TaN layer may comprise a PVD method. The PVD method may be performed under conditions including a DC power of 8-40 kW, an AC bias power of 100-900 W, a temperature of −25-300° C., and a pressure of 1 torr-10 mtorr.

In addition, the PVD conditions may further include a ratio of $N_2$ gas to Ar gas of from 1:1 to 5:1.

The TaN layer may have a thickness of 10-150 Å and/or a ratio of N to Ta atoms of from about 0.3:1 to 0.6:1.

Transforming the TaN layer into TaSiN using a radio frequency (RF) power and a remote plasma comprising $SiH_4$ gas may include: loading a structure comprising the TaN layer into a plasma reaction chamber; injecting $SiH_4$ gas into the remote plasma reaction chamber; moving Si into the surface of the TaN layer after decomposing the injected $SiH_4$ gas into Si and $2H_2$ with an Ar plasma; and/or forming the TaSiN layer by reacting the Si with the TaN layer.

The TaSiN layer may have a thickness of 10-150 Å.

An exemplary method of forming a metal line comprising the diffusion barrier layer comprising a TaSiN layer according to an embodiment of the present invention includes: forming a first metal line layer on or in an insulating layer on a substrate; forming an insulating layer on the first metal line layer; forming a via hole in the insulating layer exposing a surface portion of the first metal line layer; depositing a TaN layer on both the insulation layer having the via hole and the exposed surface of the first metal line layer using a PVD method; transforming the TaN layer into a TaSiN layer using a radio frequency (RF) power and a remote plasma comprising $SiH_4$ gas; and forming a second metal line layer on the TaSiN layer.

The second metal line layer may comprise a copper layer.

Here, forming the second metal line layer may include forming a copper seed layer on the TaSiN layer, and forming the copper layer on the copper seed layer.

In some cases, a Ta layer may be deposited on the TaSiN layer before forming the copper seed layer.

DETAILED DESCRIPTION OF THE EMBODIMENTS

An exemplary embodiment of the present invention will hereinafter be described in detail with reference to the accompanying drawings.

FIG. 1 to FIG. 4 are cross-sectional views showing a method of forming a diffusion barrier layer comprising a TaSiN layer and a method of forming a metal interconnection line including the same according to an exemplary embodiment of the present invention.

Figure 1:
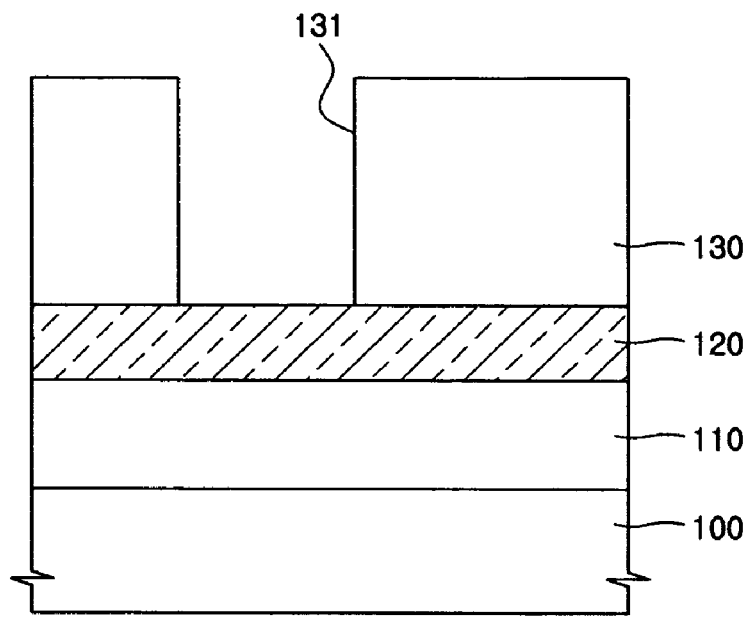
FIG. 1 to FIG. 4 are cross-sectional views showing a method of forming a diffusion barrier layer comprising a TaSiN layer and a method of forming a metal interconnection line including the same according to an exemplary embodiment of the present invention.

Referring to FIG. 1, an insulation layer 110 and a first metal line layer 120 are sequentially formed on a semiconductor substrate 100. The insulation layer 110 may be an interlayer insulation layer (e.g., an insulation layer between a polysilicon layer and a metallization layer) or an intermetal insulation layer (e.g., an insulation layer between two adjacent metallization layer). When the insulation layer 110 is an intermetal insulation layer, another lower-level metal line layer (not shown) may be located below the intermetal insulation layer. Subsequently, in this latter embodiment, an intermetal insulation layer 130 is formed on the first metal line layer 120.

The insulation layer 130 may comprise an oxide layer such as a $SiO_2$ layer, a fluorosilicate (e.g., $SiO_xF_y$) glass layer, a SiOC-based oxide layer, a nitride layer such as a $Si_3N_4$ layer, or a combination thereof. Thereafter, a photoresist layer pattern (not shown) is formed on the insulation layer 130. The photoresist layer pattern has an opening to expose a surface of the insulation layer 130 where a via hole will be formed. Next, an exposed portion of the insulation layer 130 is removed by performing an etching process using the photoresist layer pattern as an etch mask. Then, a via hole 131 penetrating the insulation layer 130 is formed so as to expose a portion of a surface of the first metal line layer 120. Since the present method is applicable to formation of copper layers (which are known to be useful in dual damascene metallization processes), the method may further comprise forming a trench (not shown) in the insulation layer 130, generally by photolithography (e.g., formation of a patterned photoresist) and etching. The trench generally partially penetrates the insulation layer 130, and thus, may have a depth of about 30-70% of the thickness of the insulation layer 130.

Figure 2:
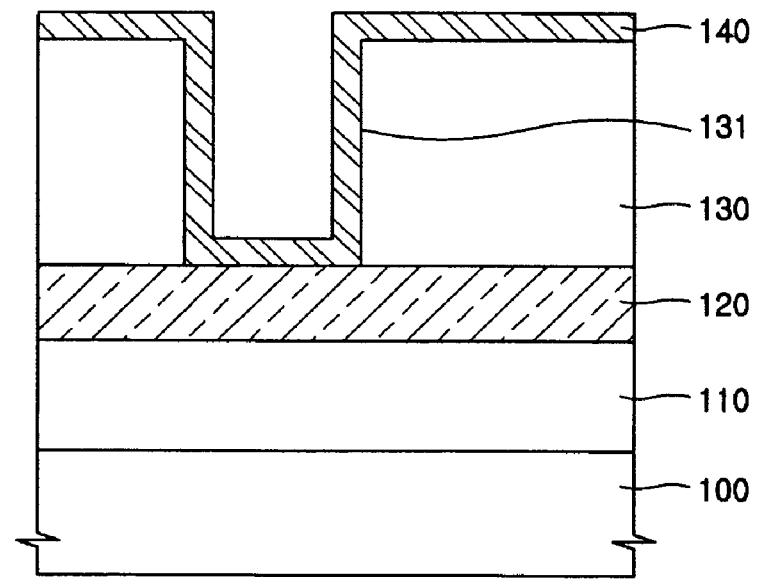

Referring to FIG. 2, a TaN layer 140 is formed on both the insulation layer 130 having the via hole 131 and the exposed surface of the first metal line layer 120 to form a TaN layer in the via hole 131. The TaN layer 140 is preferably formed by a physical vapor deposition (PVD) method (e.g., sputtering, plasma-assisted deposition, evaporation, etc.). In one embodiment, forming a TaN layer comprises sputtering Ta, then annealing the Ta layer in the presence of a nitrogen source (e.g., nitrogen gas, ammonia, etc.). Alternatively, TaN layer comprises sputtering Ta in the presence of a plasma comprising the nitrogen source (such as nitrogen gas). Also, TaN may be sputtered directly from a TaN target. The TaN may not be stoichiometric. As a result, a ratio of N to Ta in the TaN layer may be from about 0.3:1 to about 0.6:1, and a thickness of the TaN layer 140 may be about 10-150 Å. The PVD process may further comprise conditions including a DC power of 8-40 kW, an AC bias power of 100-900 W, a temperature of −25-300° C., a pressure of 1 torr-10 mtorr, and/or a ratio of $N_2$ gas to Ar gas of from 1:1 to 5:1.

Figure 3:
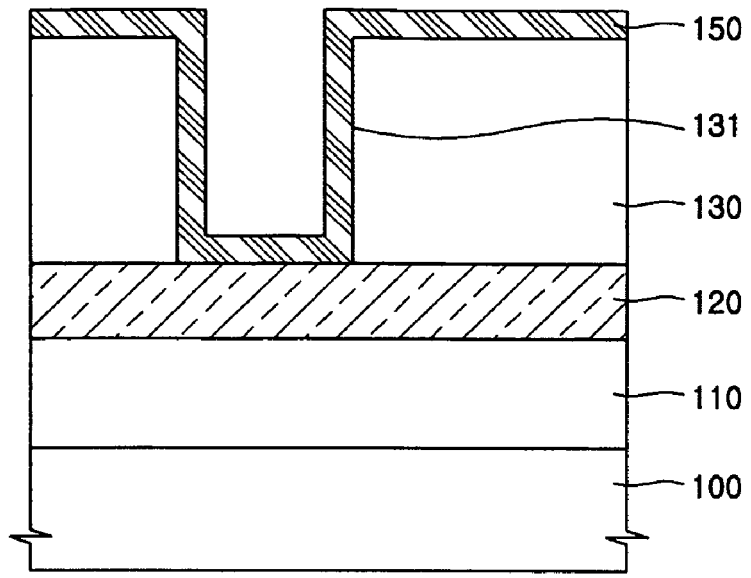

Referring to FIG. 3, the TaN layer 140 (refer to FIG. 2) is transformed into a TaSiN layer 150 using a radio frequency (RF) power and a remote plasma comprising a silane (e.g., $SiH_4$) gas. More particularly, the substrate 100 having the TaN layer 140 (refer to FIG. 2) thereon may be loaded into a plasma reaction chamber (e.g., a remote plasma reaction chamber). Subsequently, the silane (e.g., $SiH_4$) gas is injected or otherwise introduced into the plasma reaction chamber. Then, the silane ($SiH_4$) gas may be decomposed into Si and $2H_2$ (or a silicon atom source and hydrogen and/or hydrogen-containing byproducts) by an Ar plasma (e.g., a plasma comprising Ar) formed in the plasma reaction chamber.

Consequently, when the decomposed Si atom source (Si or other reactive Si-containing species such as $H_3Si$· or $H_3Si^+$) moves toward a surface of the TaN layer 140 (refer to FIG. 2), a TaSiN layer 150 is formed by reacting the Si or Si atom source with the TaN layer 140 (refer to FIG. 2). Here, a thickness of the TaSiN layer 150 may be about 10-150 Å.

Figure 4:
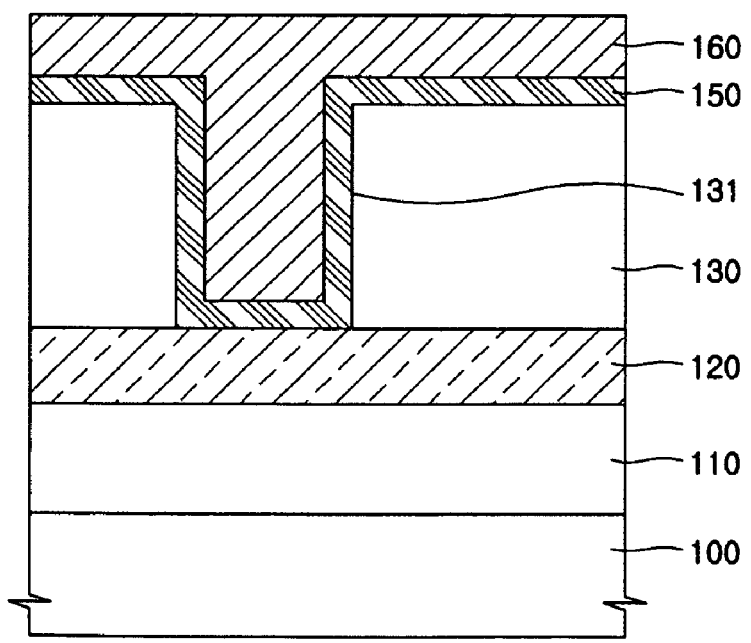

Referring to FIG. 4, after forming the TaSiN layer 150 as a diffusion barrier layer, a second metal layer 160 is formed on the TaSiN layer 150. The second metal layer 160 may comprise a copper layer, which may be formed by depositing a copper seed layer (not shown) on the TaSiN layer 150 (generally by PVD, chemical vapor deposition [CVD], or atomic layer deposition [ALD]), and then electroplating a bulk copper layer on the copper seed layer. However, a method other than electroplating can be used for forming the copper layer on the copper seed layer. In some cases, a Ta adhesive and/or seed layer is first deposited on the TaSiN layer 150 before forming the copper seed layer (or in place of the copper seed layer), and then the copper layer may be formed thereafter (e.g., after forming the Ta layer or forming the copper seed layer on the Ta layer).

Alternatively, the second metal layer 160 may comprise a tungsten (W) layer deposited by CVD. In this case, the TaSiN layer 150 may be deposited on an adhesive layer (such as Ti) that is formed on the insulator layer 130 and exposed surface of the first metal layer 120 (generally by a PVD method).

As described above, according to an exemplary embodiment of the present invention, a TaSiN layer which may be appropriate for a device having a scale of 60 nm or less may be formed as a diffusion barrier layer using a PVD method, which may deposit a thin film having excellent diffusion barrier and/or step coverage properties by a simple process. Also, a metal line may be formed thereon, using such a TaSiN layer as a diffusion barrier layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

For example, the exemplary embodiment of the present invention can also be used in forming a metal line having a single damascene or dual damascene structure.

What is claimed is:

1. A method of forming a metal line, comprising:
   forming a via hole in an insulating layer on a substrate to expose a surface portion of a first layer;
   depositing a TaN layer having a ratio of N to Ta from about 0.3:1 to about 0.6:1 on both the insulation layer having the via hole and the exposed surface of the first layer using a PVD method, wherein the PVD method comprises conditions including a DC power of 8-40 kW;
   transforming the TaN layer into a TaSiN layer using a radio frequency (RF) power and a remote plasma using a silane gas;
   depositing a Ta layer on the TaSiN layer; and
   forming an upper metal layer on the Ta layer.

2. The method of claim 1, wherein the first layer is a lower metal layer or a silicon layer, and forming the via hole in the insulating layer exposes the surface portion of the lower metal layer or silicon layer.

3. The method of claim 2, wherein the first layer is a lower metal layer or a silicon layer, the method further comprising:
   forming the lower metal layer or silicon layer in or on the substrate; and forming the insulating layer on the lower metal layer or silicon layer.

4. The method of claim 1, wherein transforming the TaN layer into the TaSiN layer comprises:
loading the substrate with the TaN layer thereon into a plasma reaction chamber;
injecting $SiH_4$ gas into the plasma reaction chamber; and
forming the TaSiN layer by reacting Si or a source of Si atoms with the TaN layer.

5. The method of claim 1, wherein the upper metal layer comprises a copper layer.

6. The method of claim 5, wherein forming the copper layer comprises:
forming a copper seed layer on the TaSiN layer; and
forming a bulk copper layer on the copper seed layer.

7. The method of claim 6, further comprising depositing the Ta layer on the TaSiN layer before forming the copper seed layer.

8. The method of claim 1, wherein the silane gas comprises $SiH_4$.

9. The method of claim 1, wherein the PVD method comprises conditions further including an AC bias power of 100-900 W, a temperature of −25-300° C., and/or a pressure of 1 torr-10 mtorr.

10. The method of claim 1, wherein the PVD method comprises conditions including an AC bias power of 100-900 W.

11. The method of claim 1, wherein the PVD method comprises conditions including a temperature of −25-300° C.

12. The method of claim 1, wherein the PVD method comprises conditions including a pressure of 1 torr-10 mtorr.

13. The method of claim 1, wherein the PVD method comprises depositing Ta in a plasma comprising a nitrogen source.

14. The method of claim 1, wherein the PVD method comprises depositing Ta in a plasma comprising a gas mixture of $N_2$ and Ar, wherein a ratio of $N_2$ to Ar is from 1:1 to 5:1.

15. The method of claim 1, wherein the TaN layer has a thickness of 10-150 Å.

16. The method of claim 1, wherein the first layer is a silicon layer, and forming the via hole in the insulating layer exposes the surface portion of the silicon layer.

17. The method of claim 1, wherein the first layer is a lower metal layer or a silicon layer.

18. The method of claim 1, wherein the insulating layer comprises $SiO_2$, a fluorosilicate glass, a SiOC-based oxide, a nitride, or a combination thereof.

19. The method of claim 18, wherein the insulating layer comprises the fluorosilicate glass, and the fluorosilicate glass has a formula $SiO_xF_y$.

20. The method of claim 18, wherein the insulating layer comprises the nitride, and the nitride has a formula $Si_3N_4$.

* * * * *